(12) United States Patent
Mita

(10) Patent No.: US 8,104,155 B2
(45) Date of Patent: Jan. 31, 2012

(54) METHOD OF MANUFACTURING A PIEZOELECTRIC ACTUATOR

(75) Inventor: Tsuyoshi Mita, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 174 days.

(21) Appl. No.: 12/413,019

(22) Filed: Mar. 27, 2009

(65) Prior Publication Data

US 2009/0244203 A1 Oct. 1, 2009

(30) Foreign Application Priority Data

Mar. 28, 2008 (JP) .................................. 2008-086713

(51) Int. Cl.
*H04R 17/10* (2006.01)
(52) U.S. Cl. .......... 29/25.35; 29/846; 310/364; 310/366
(58) Field of Classification Search ................. 29/25.35, 29/846, 852; 310/364, 366
See application file for complete search history.

(56) References Cited

U.S. PATENT DOCUMENTS 7,148,607 B2 * 12/2006 Sato .......................... 310/366 X

FOREIGN PATENT DOCUMENTS

| JP | 63200607 A | * | 8/1988 | ................. 29/25.35 |
| JP | 2001-113712 A | | 4/2001 | |
| JP | 2002-217468 A | | 8/2002 | |

* cited by examiner

*Primary Examiner* — A. Dexter Tugbang
(74) *Attorney, Agent, or Firm* — Birch, Stewart, Kolasch & Birch, LLP

(57) ABSTRACT

The method of manufacturing a piezoelectric actuator, includes the steps of: forming a lower electrode film on an insulating substrate; forming a piezoelectric film on the lower electrode film; forming a slit on the piezoelectric film to expose a portion of the lower electrode film on an upper surface side of the piezoelectric film; forming an insulating layer which covers a portion of the piezoelectric film; forming an upper electrode film so as to span the insulating layer and the piezoelectric film; forming, on the piezoelectric film, a lower wire in connection with the portion of the lower electrode film exposed through the slit; depositing a first metal film on the lower wire and thereby making a film thickness of the lower wire greater than a film thickness of the lower electrode film; and depositing a second metal film on a portion of the upper electrode film on the insulating layer and thereby making a film thickness of the portion of the upper electrode film on the insulating layer greater than a film thickness of a portion of the upper electrode film that has been deposited directly on the piezoelectric film.

3 Claims, 12 Drawing Sheets

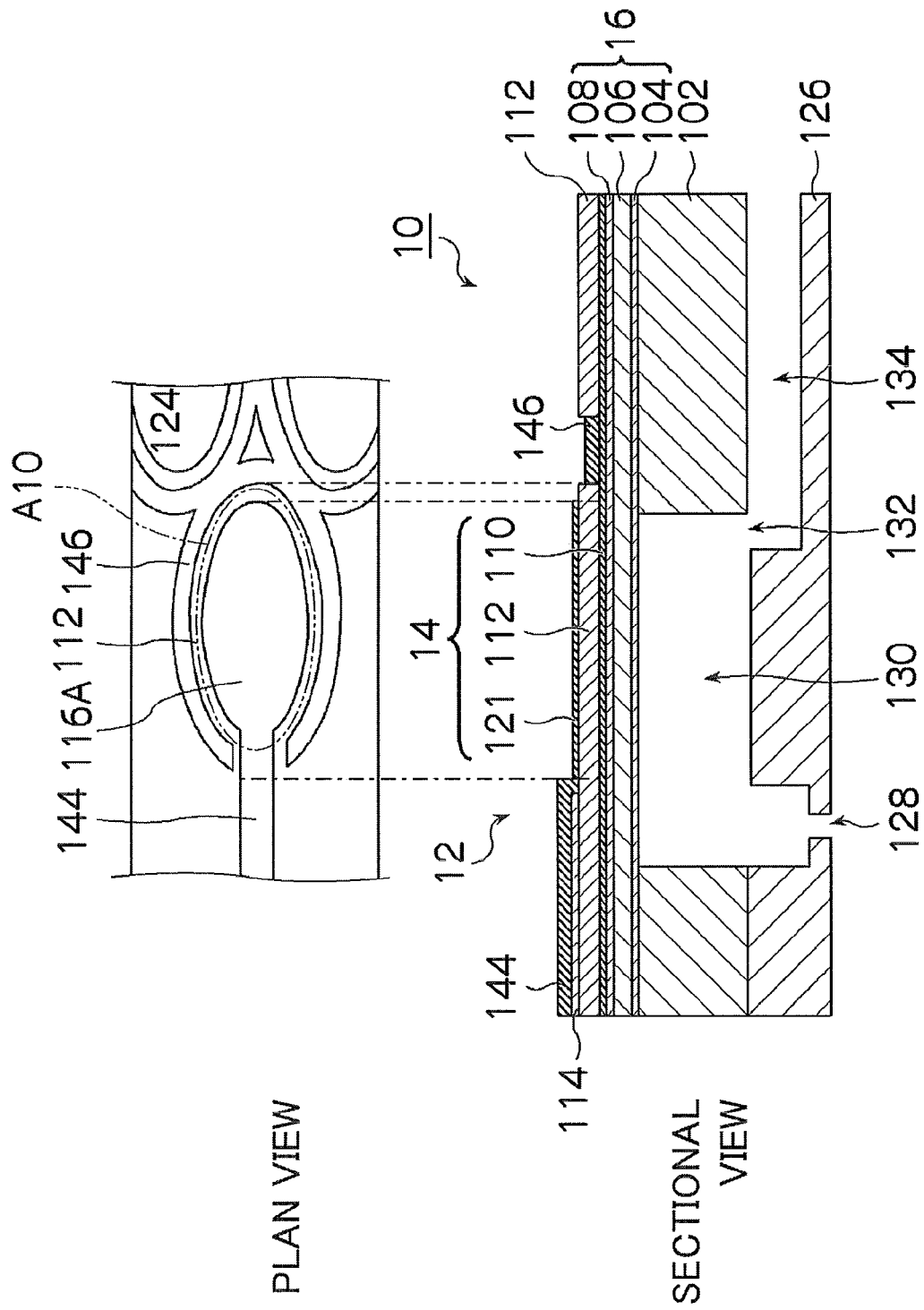

METHOD OF MANUFACTURING A PIEZOELECTRIC ACTUATOR

BACKGROUND OF THE INVENTION

1. Field of the Invention

The present invention relates to a method of manufacturing a piezoelectric actuator and a liquid ejection head, and more particularly to a method of manufacturing a piezoelectric actuator in which a piezoelectric film is arranged between two electrode films, and a liquid ejection head comprising this piezoelectric actuator.

2. Description of the Related Art

Japanese Patent Application Publication No. 2001-113712 discloses a method of manufacturing an inkjet head in which films of an electrode member, a piezoelectric member and a diaphragm member are deposited onto each of a plurality of substrates, and the diaphragm member on the plurality of substrates after the film deposition is bonded with a pressure chamber component having a surface area that is broader than the combined surface area of the plurality of substrates.

Japanese Patent Application Publication No. 2002-217468 discloses a method of manufacturing an electronic component in which a first electrode is formed on one surface of a piezoelectric member layer, a second electrode having a substrate for thin film formation is formed on the other surface of the piezoelectric member layer, and the substrate for the thin film formation is then removed from the second electrode by using an etching liquid.

In the related art, there is known a piezoelectric actuator having a multiple-element structure in which a plurality of piezoelectric elements are formed on one substrate. The piezoelectric actuator is used in a liquid ejection head (inkjet head) of an inkjet recording type, for example.

When a film of piezoelectric material (e.g., Pb (lead) zirconate titanate (PZT)) is deposited on a substrate, the properties of the piezoelectric film thus deposited are greatly affected by the substrate on which the film is deposited and the layers interposed between the substrate and the piezoelectric film. For example, the stress applied to the piezoelectric film by the substrate or the interposed layer gives rises to cracking in the piezoelectric film, affects the so-called piezoelectric constant, and also affects the long-term reliability of the piezoelectric film.

At present, liquid ejection heads which have a large number of nozzles per unit surface area (a high nozzle density) are sought. When driving a liquid ejection head having a high nozzle density, since a large number of piezoelectric elements are driven simultaneously in comparison with the related art, it is necessary to reduce the electrical resistance of the wiring portions that supply electricity to the piezoelectric elements. However, if a lower electrode (common electrode) and a piezoelectric film are formed on a substrate of insulating material (e.g., silicon (Si)), then it is difficult to reduce the electrical resistance of the lower electrode.

Neither Japanese Patent Application Publication No. 2001-113712 nor Japanese Patent Application Publication No. 2002-217468 resolves the problem of reducing the electrical resistance of the wiring portions. In Japanese Patent Application Publication No. 2001-113712, a diaphragm is deposited as a film and bonded to a pressure chamber component; however, if a diaphragm of several micrometers ($\mu$m) or greater is deposited, then it is difficult to control the stress in the diaphragm. Moreover, if the deposited diaphragm is bonded as in Japanese Patent Application Publication No. 2001-113712, then there is a risk of variation in performance between the respective piezoelectric elements, due to non-uniformity in the thickness of the adhesive. Furthermore, it is also difficult to achieve matching with other processes. In Japanese Patent Application Publication No. 2002-217468, as well as the fact that the deposition substrate is wasted, it is also difficult to achieve matching with other processes.

One possible way of reducing the electrical resistance of the lower electrode (common electrode) is to increase the film thickness of the lower electrode. However, if the thickness of the lower electrode is increased, then stress in the film becomes more difficult to control and there is a drawback in that the reliability of the piezoelectric elements declines.

SUMMARY OF THE INVENTION

The present invention has been contrived in view of these circumstances, an object thereof being to provide a method of manufacturing a piezoelectric actuator, and a liquid ejection head, whereby, in a piezoelectric actuator in which a piezoelectric film is provided between two electrode films, the electrical resistance of the wire portions which supply electricity to the piezoelectric film can be reduced while ensuring the reliability of the piezoelectric actuator.

In order to attain the aforementioned object, the present invention is directed to a method of manufacturing a piezoelectric actuator, comprising the steps of: forming a lower electrode film on an insulating substrate; forming a piezoelectric film on the lower electrode film; forming a slit on the piezoelectric film to expose a portion of the lower electrode film on an upper surface side of the piezoelectric film; forming an insulating layer which covers a portion of the piezoelectric film; forming an upper electrode film so as to span the insulating layer and the piezoelectric film; forming, on the piezoelectric film, a lower wire in connection with the portion of the lower electrode film exposed through the slit; depositing a first metal film on the lower wire and thereby making a film thickness of the lower wire greater than a film thickness of the lower electrode film; and depositing a second metal film on a portion of the upper electrode film on the insulating layer and thereby making a film thickness of the portion of the upper electrode film on the insulating layer greater than a film thickness of a portion of the upper electrode film that has been deposited directly on the piezoelectric film.

Preferably, the first and second metal films are simultaneously deposited by carrying out electrolytic plating on the lower wire and the portion of the upper electrode film on the insulating layer.

Preferably, the method further comprises the step of forming a third metal film which covers the piezoelectric film in which the slit has been formed, and is in connection with the portion of the lower electrode film exposed through the slit, wherein: in the upper electrode film forming step, the upper electrode film is formed by patterning the third metal film to separate a portion of the third metal film from the portion of the lower electrode film exposed through the slit; and in the lower wire forming step, the lower wire is formed by patterning the third metal film.

In order to attain the aforementioned object, the present invention is also directed to a method of manufacturing a piezoelectric actuator, comprising the steps of: forming a lower electrode film on an insulating substrate; forming a piezoelectric film on the lower electrode film; forming a slit on the piezoelectric film to expose a portion of the lower electrode film on an upper surface side of the piezoelectric film; forming an insulating layer on a portion of the piezoelectric film; forming an upper electrode film so as to span the insulating layer and the piezoelectric film; depositing a first metal film on the portion of the lower electrode film exposed through the slit and thereby making a film thickness of the portion of the lower electrode film exposed through the slit greater than film thicknesses of other portions of the lower electrode film; and depositing a second metal film on a portion of the upper electrode film on the insulating layer and thereby making a film thickness of the portion of the upper electrode film on the insulating layer greater than a film thickness of a portion of the upper electrode film that has been deposited directly on the piezoelectric film.

Preferably, the first and second metal films are simultaneously deposited by carrying out electrolytic plating on the portion of the lower electrode film exposed through the slit and the portion of the upper electrode film on the insulating layer.

Preferably, the method further comprises the steps of: forming, on the piezoelectric film, a lower wire which is in connection with the portion of the lower electrode film exposed through the slit; and depositing a third metal film on the lower wire and thereby making a film thickness of the lower wire greater than a film thickness of the lower electrode film.

Preferably, the first, second and third metal films are simultaneously deposited by carrying out electrolytic plating on the portion of the lower electrode film exposed through the slit, the portion of the upper electrode film on the insulating layer, and the lower wire.

In order to attain the aforementioned object, the present invention is also directed to a liquid ejection head, comprising: an insulating layer; a lower electrode film which is formed on the insulating layer; a piezoelectric film which is formed on the lower electrode film and has a slit through which a portion of the lower electrode is exposed on an upper surface side of the piezoelectric film; a lower wire which is formed on the piezoelectric film, is in connection with the portion of the lower electrode film through the slit, and has a greater film thickness than the lower electrode film; an insulating layer which is formed on the piezoelectric film and covers a portion of the piezoelectric film; and an upper electrode film which spans the insulating layer and the piezoelectric film, a film thickness of a portion of the upper electrode film on the insulating layer being greater than a film thickness of a portion the upper electrode film on the piezoelectric film.

In order to attain the aforementioned object, the present invention is also directed to a liquid ejection head, comprising: an insulating layer; a lower electrode film which is formed on the insulating layer; a piezoelectric film which is formed on the lower electrode film and has a slit through which a portion of the lower electrode is exposed on an upper surface side of the piezoelectric film; an insulating layer which is formed on the piezoelectric film and covers a portion of the piezoelectric film; and an upper electrode film which spans the insulating layer and the piezoelectric film, a film thickness of a portion of the upper electrode film on the insulating layer being greater than a film thickness of a portion of the upper electrode film on the piezoelectric film, wherein a film thickness of the portion of the lower electrode film exposed through the slit is greater than film thicknesses of other portions of the lower electrode film.

In order to attain the aforementioned object, the present invention is also directed to a liquid ejection head, comprising: an insulating layer; a lower electrode film which is formed on the insulating layer; a piezoelectric film which is formed on the lower electrode film and has a slit through which a portion of the lower electrode is exposed on an upper surface side of the piezoelectric film; a lower wire which is formed on the piezoelectric film, is in connection with the portion of the lower electrode film through the slit, and has a greater film thickness than the lower electrode film; an insulating layer which is formed on the piezoelectric film and covers a portion of the piezoelectric film; and an upper electrode film formed so as to span the insulating layer and the piezoelectric film, the film thickness of a portion thereof on top of the insulating layer being greater than the film thickness of a portion thereof on top of the piezoelectric film, wherein a film thickness of the portion of the lower electrode film exposed through the slit is greater than film thicknesses of other portions of the lower electrode film.

According to the present invention, by increasing the film thickness of the wire portions that supply electricity to the piezoelectric element through the upper electrode film and the lower electrode film, it is possible to reduce the electrical resistances of the respective wires, without thickening the upper electrode film and the lower electrode film positioned in the active portion. The present embodiment is suitable for a liquid ejection head having a multiple-element structure and a high nozzle density.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 3 is a diagram showing a liquid ejection head according to a second embodiment of the present invention;

DETAILED DESCRIPTION OF THE PREFERRED EMBODIMENTS

First Embodiment

Figure 1:
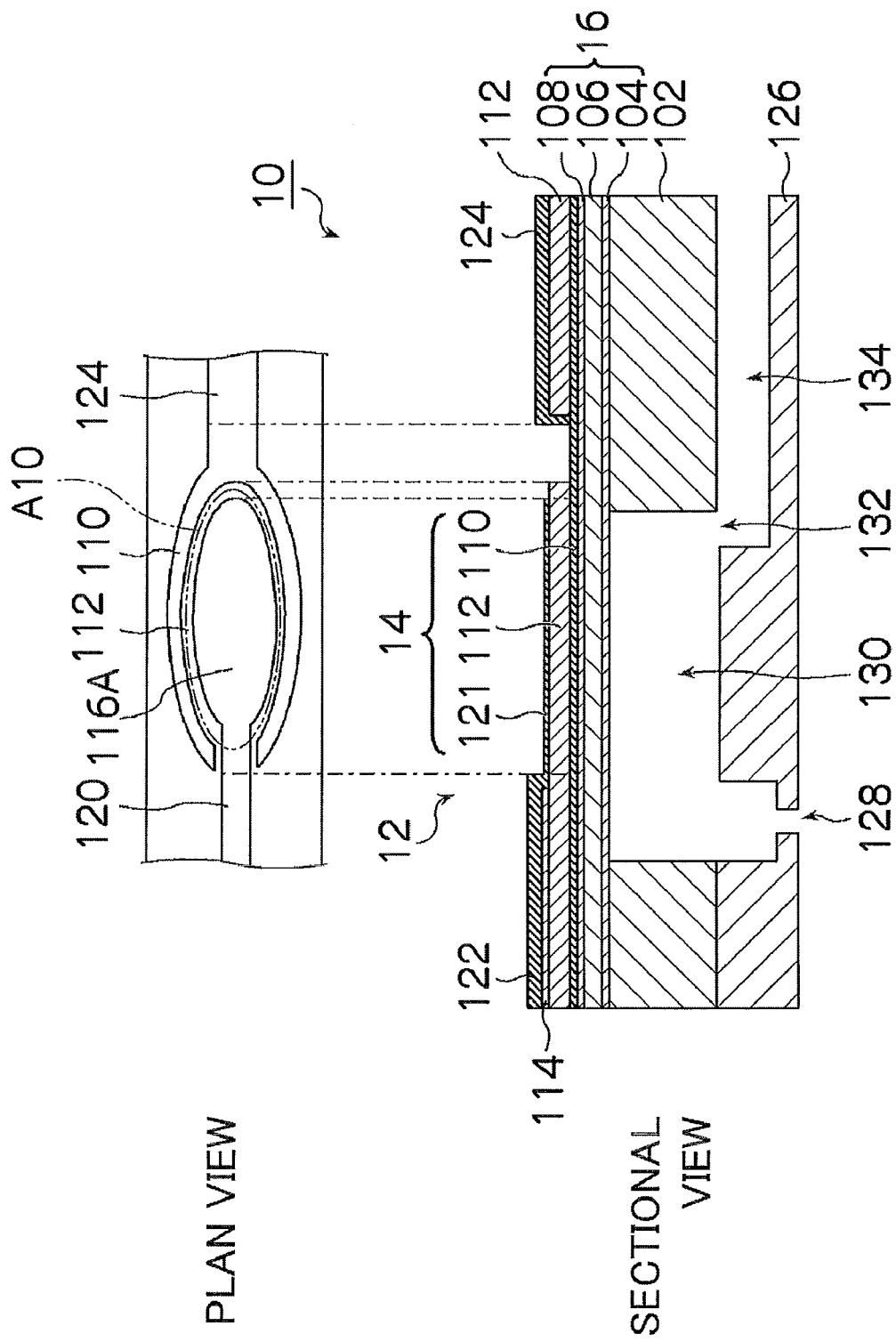
FIG. 1 is a diagram showing a liquid ejection head according to a first embodiment of the present invention.

FIG. 1 is a diagram showing a plan view and a cross-sectional view of a liquid ejection head according to a first embodiment of the present invention.

As shown in FIG. 1, the liquid ejection head 10 (hereinafter also referred to as a "recording head") according to the present embodiment includes: a nozzle 128, which forms an ink ejection port; a pressure chamber 130, which is connected to the nozzle 128; and a piezoelectric actuator 12, which alters the internal volume of the pressure chamber 130.

Figure 7:
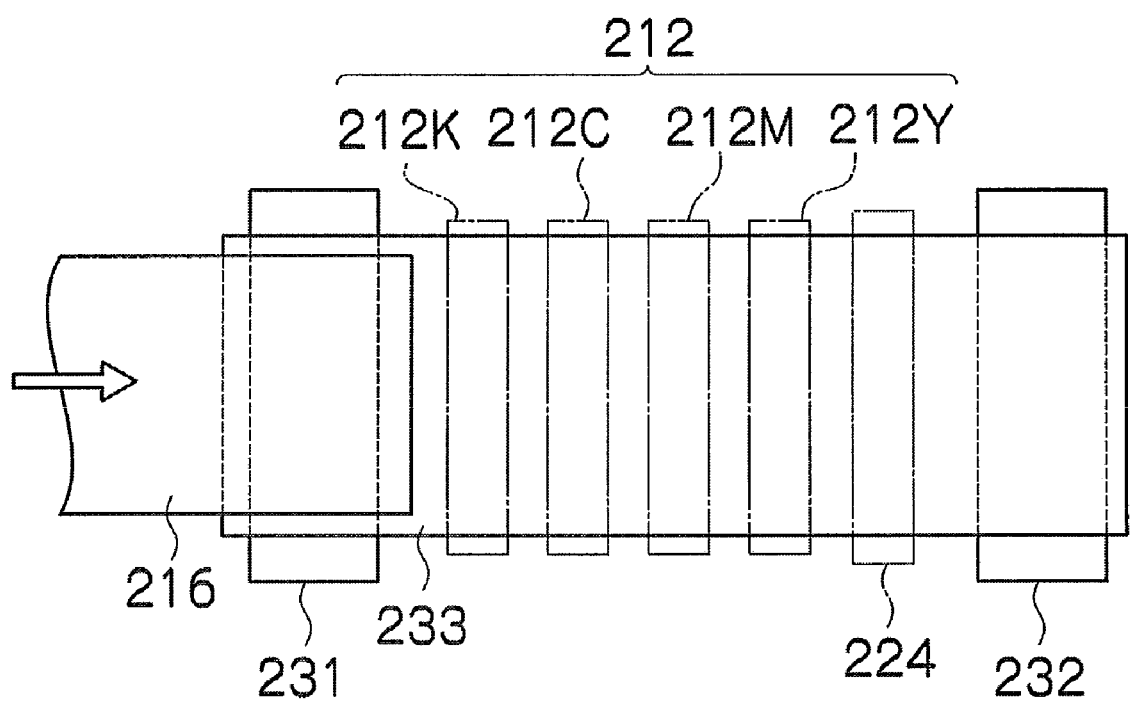
FIG. 7 is a principal plan diagram showing the peripheral area of a printing unit of the inkjet recording apparatus.

Although not shown in FIG. 1, there are a plurality of the nozzles 128 arranged in a two-dimensional arrangement (matrix configuration) in the ejection face (nozzle surface) of the recording head 10. The pressure chambers 130 corresponding respectively to the nozzles 128 are arranged inside the recording head 10, and each nozzle 128 is connected to the corresponding pressure chamber 130. Ink supply ports 132 are formed respectively at ends of the pressure chambers 130 (the ends on the opposite sides to the sides where the nozzles 128 are connected in FIG. 1). The pressure chambers 130 are connected to a common flow channel 134 through the ink supply ports 132, and the ink inside the common flow channel 134 is thereby distributed and supplied to the pressure chambers 130. Ink is supplied to the common flow channel 134 from an ink tank, which is disposed in an ink storing and loading unit 214 shown in FIG. 7.

As shown in FIG. 1, the piezoelectric actuator 12 has a lower electrode film 110 deposited on a diaphragm 16 constituting a wall of the pressure chamber 130 (the upper surface in FIG. 1), a piezoelectric film 112 deposited on the lower electrode film 110, and an upper electrode film 121 deposited on the piezoelectric film 112, and the piezoelectric actuator 12 is formed at a position corresponding to each pressure chamber 130. The lower electrode film 110, the piezoelectric film 112 and the upper electrode film 121 corresponding to each of pressure chamber 130 constitute the piezoelectric element 14, which applies pressure to the diaphragm 16 and thereby pressurizes the ink inside the pressure chamber 130.

The piezoelectric actuator 12 in the present embodiment has a structure in which the lower electrode film 110 is a common electrode, and the upper electrode film 121 is an individual electrode (i.e., an upper address structure). The upper electrode film 121 extends onto the upper face of an insulating layer 114. Below, the portion of the upper electrode film 121 extending on the insulating layer 114 is referred to as an upper wire 122. The upper wire 122 is connected to an external wire (e.g., a flexible cable) (not shown).

On the other hand, the lower electrode film 110 corresponding to the respective pressure chambers 130 is connected to lower wires 124, which are formed on the upper surface of the piezoelectric film 112. The lower wires 124 are connected electrically to each other at a position that is not illustrated, and they are earthed.

The upper wire 122 and the lower wire 124 are both formed on the piezoelectric film 112, and are deposited by electroplating to a greater thickness (e.g., 2 μm to 3 μm) than the upper electrode film 121 and the lower electrode film 110.

In a mode where the lower electrode film 30 is a common electrode, it is possible to form the lower electrode film 110 over the whole surface of the diaphragm 16.

The piezoelectric film 112 is a piezoelectric body made of a metallic oxide that has the perovskite crystal structure (hereinafter also referred to as the "perovskite structure"), which is generally represented by $ABO_3$, where A includes at least one of Pb and Ba, B includes at least one of Zr and Ti, and O is oxygen. Moreover, B may also include at least one of V, Nb and Ta. The piezoelectric body 112 may be made of, for example, lead zirconate titanate (PZT; $Pb(Zr, Ti)O_3$) or barium titanate ($BaTiO_3$). Here, the "perovskite structure" means that the peak of $ABO_3$ is the first peak in X-ray diffraction (XRD).

When a prescribed drive signal is supplied to the upper electrode film 121 from a head driver 284 (shown in FIG. 9) through the external wire and the upper wire 122, thereby an electric field is applied to the piezoelectric film 112 disposed between the lower electrode film 110 and the upper electrode film 121, the diaphragm 16 deforms so as to project toward the pressure chamber 130 side due to the displacement (expansion and contraction) of the piezoelectric film 112. Consequently, the ink inside the pressure chamber 130 is pressurized and an ink droplet is ejected from the nozzle 128 connected to the pressure chamber 130. Below, a portion of the piezoelectric film 112 on which the upper electrode film 121 is directly deposited (the portion that is displaced by directly applying an electric field from the upper electrode film 121) is referred to as an "active portion A10", and the portion of the piezoelectric film 112 apart from the active portion A10 (i.e., the portion of the piezoelectric film 112 on which the upper electrode film 121 is not directly deposited (including the portion where the upper wire 122 and the lower wire 124 are formed)) is referred to as a "non-active portion".

When the diaphragm 16 returns to its original state after the ejection of ink, new ink is supplied to the pressure chamber 130 from the common flow channel 134 through the ink supply port 132, thus preparing for the next ink ejection operation.

Next, a method of manufacturing the piezoelectric actuator according to the present embodiment is described. FIGS. 2A to 2K are cross-sectional diagrams showing the steps of the method of manufacturing the liquid ejection head (recording head) having the piezoelectric actuator according to the first embodiment of the present invention.

Figure 2A:
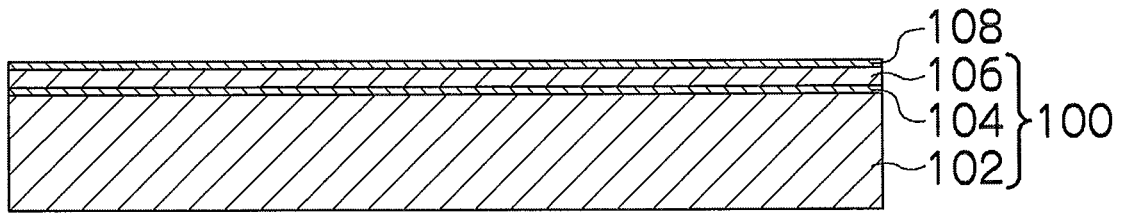
FIGS. 2A to 2K are cross-sectional diagrams showing the steps of a method of manufacturing a liquid ejection head having a piezoelectric actuator according to the first embodiment.

Firstly, an SOI (silicon on insulator) substrate 100 having an insulating layer 108 formed on the surface thereof (the upper surface in the drawings) is prepared (FIG. 2A). The SOI substrate 100 is a multiple-layer substrate, which has a supporting layer 102 constituted of a silicon (Si) substrate, a box layer 104 constituted of a silicon oxide ($SiO_2$) film, and an active layer 106 constituted of a silicon (Si) substrate. The insulating layer 108 is a silicon oxide ($SiO_2$) film, for example, and is formed for instance by a thermal oxidation method, a sputtering method, or a chemical vapor deposition (CVD) method. As the material of the insulating layer 108, apart from the silicon oxide described above, it is also possible to use another oxide such as $ZrO_2$, $Al_2O_3$, or the like, a nitride, such as SiCN, TiAlN, $Si_3N_4$, TiAlCrN, or the like, an oxynitride, such as SiON, or a resin.

Figure 2B:
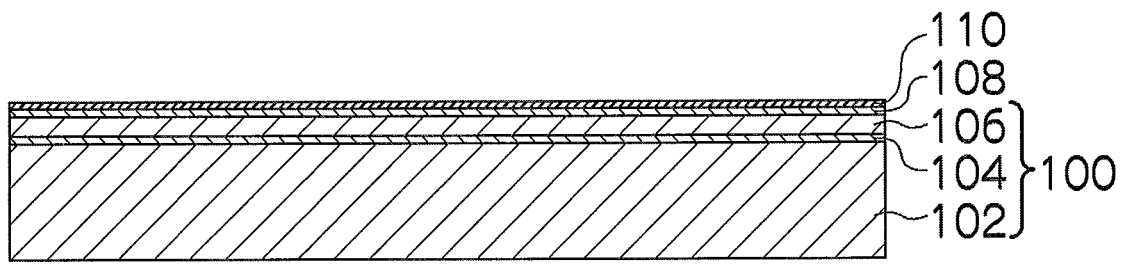

Next, a lower electrode film 110 is formed over the whole surface of the insulating layer 108 (FIG. 2B). The material of the lower electrode film 110 is, for example, Ir, Pt, Ti, Ti—Ir, TiW—Ir, Ti—Pt or TiW—Pt. The method of forming the lower electrode film 110 is sputtering, vapor deposition or CVD. The thickness of the lower electrode film 110 is 100 nm to 300 nm, for example.

Subsequently, the lower electrode film 110 is patterned by etching. More specifically, the lower electrode film 110 is divided into individual areas for the respective pressure chambers 130 (see FIG. 1) by dry etching (RIE). Instead of forming the solid lower electrode film 110 over the insulating layer 108 and then etching, it is also possible to form pieces of lower electrode film 110 at positions corresponding to the respective pressure chambers 130, by means of a lift-off film deposition method which uses a resist.

Figure 2C:
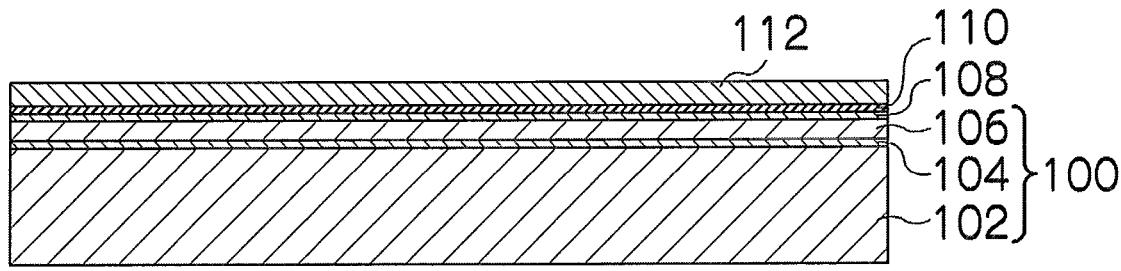

Next, a piezoelectric film 112 is formed on the upper surface of the S01 substrate 100, so as to cover the lower electrode film 110, which is situated on the insulating layer 108 (FIG. 2C). More specifically, the piezoelectric film 112 constituted of a metal oxide having the perovskite crystal structure represented by the general formula $ABO_3$ described above is deposited. The method of forming the piezoelectric film 112 having the perovskite structure is, for example, sputtering, sol gelation, CVD, or aerosol deposition. Of the film deposition methods described above, sputtering is desirable from the viewpoint of thickness and piezoelectric characteristics. In the present embodiment, the piezoelectric film 112 having the perovskite structure is deposited by a sputtering method. The temperature when forming the piezoelectric film 112 by sputtering (film depositing temperature) is 500° C. or higher. Furthermore, the film thickness of the piezoelectric film 112 is 4 µm to 5 µm, for example.

Figure 2D:
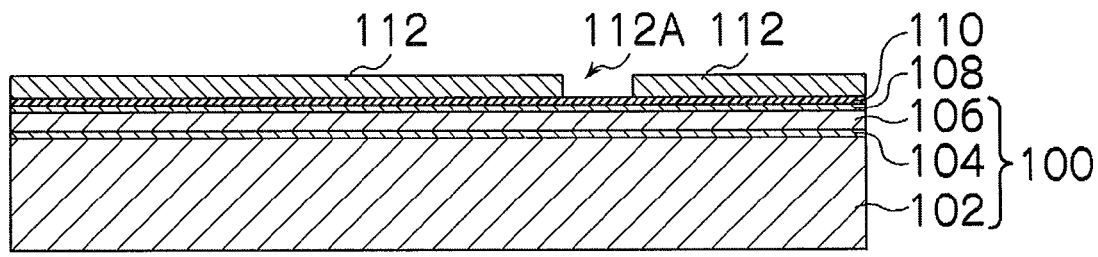

Next, the piezoelectric film 112 is patterned by etching and a portion of the lower electrode film 110 is exposed on the upper surface in the drawing (FIG. 2D). More specifically, the piezoelectric film 112 is patterned by dry etching (RIE) using a fluoride or chloride gas or wet etching, and employing an organic film or metal film as a mask.

After depositing the piezoelectric film 112, the piezoelectric film 112 is subjected to an annealing process at a prescribed heating temperature (annealing temperature) in an oxygen atmosphere. The annealing temperature is equal to or lower than the film formation temperature of the piezoelectric film 112. By this means, film peeling of the piezoelectric film 112 can be prevented while improving the piezoelectric characteristics thereof. Furthermore, it is desirable that the concentration of oxygen in the oxygen atmosphere where the annealing process is carried out should be 10 vol % or above. By means of the annealing process described above, it is possible further to improve the piezoelectric characteristics of the piezoelectric film 112.

Figure 2E:
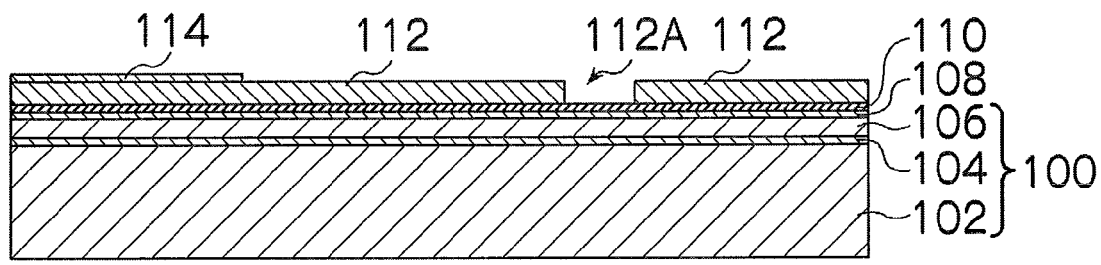

Next, a layer of insulating material (hereinafter referred to as an "insulating layer") 114 is formed on the upper surface of the piezoelectric film 112 (FIG. 2E). The material of the insulating layer 114 is, for instance, an organic material such as Su-8 or polyimide, or an inorganic material such as $SiO_2$ or SiN.

Figure 2F:
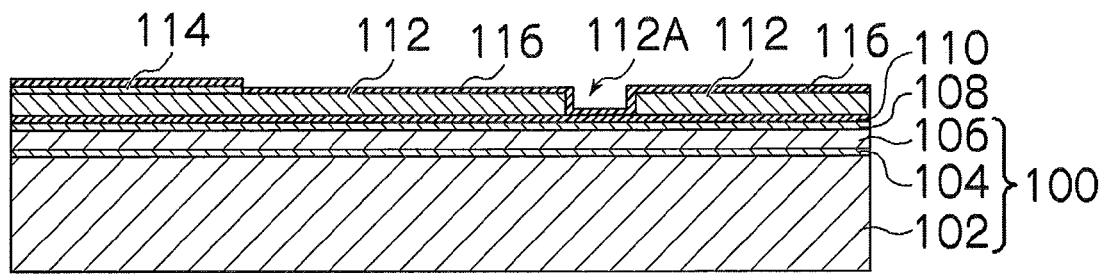

Next, a metal film (hereinafter referred to as a "seed film") 116 is formed on the piezoelectric film 112 and the insulating layer 114 (FIG. 2F). As shown in FIG. 2F, the seed film 116 is connected to the lower electrode film 110 exposed by etching through a slit 112A that is formed in the piezoelectric film 112. Here, the material of the seed film 116 is an alloy material, such as TiW—Au, Ti—Au, TiW—Cu or Ti—Cu, for instance. Furthermore, the thickness of the seed film 116 is 100 nm to 300 nm, for example.

Next, the seed film 116 is patterned by etching. More specifically, the seed film 116 is patterned by dry etching (RIE) using a fluoride or chloride gas or wet etching, and employing an organic film or metal film as a mask.

Figure 2G:
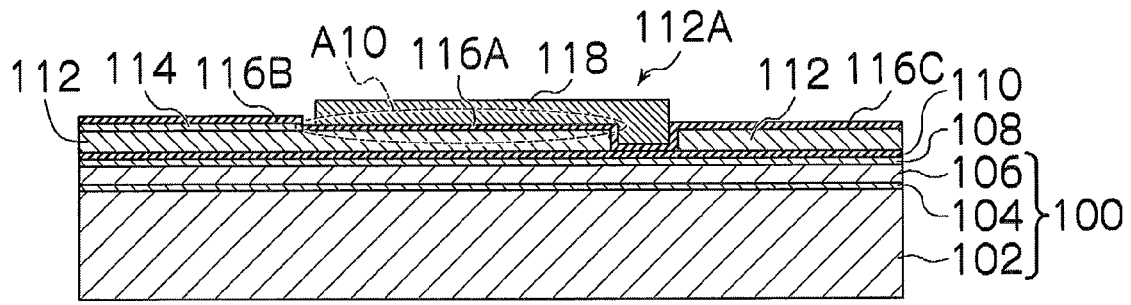

Thereupon, resist 118 is applied on the seed film 116 (FIG. 2G). The resist 118 is a film of organic material, for example, which covers the active portion A10 and is applied so as to bury the slit 112A.

Figure 2H:
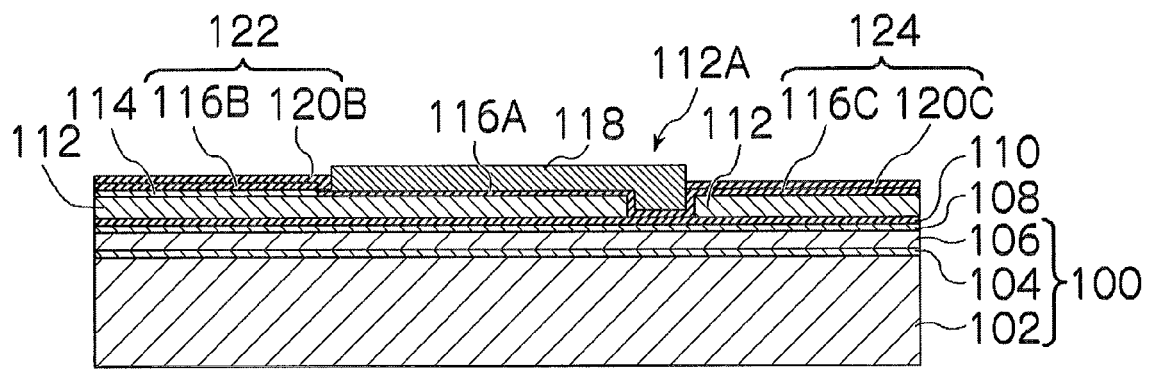
Figure 2I:
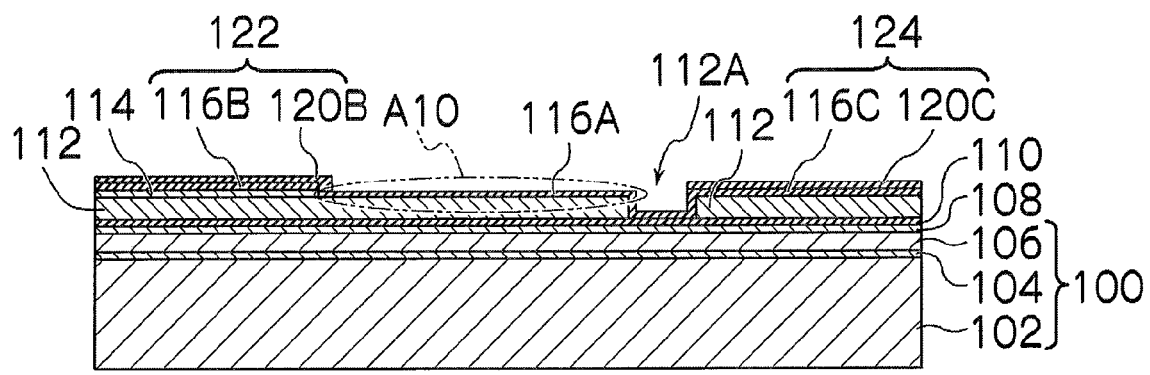

Thereupon, a metal film (hereinafter referred to as a "plating film") 120 is deposited by electroplating on the portions 116B and 116C of the seed film 116 where the resist 118 has not been applied (FIG. 2H). Here, the plating film 120 is formed up to a portion as near as possible to the active portion A10 on the seed film 116. The material of the plating film 120 is the similar material as that used in the exposed portion of the seed film 116 on the upper surface in the drawing (for example, the material of the plating film 120 is Au if the material of the seed film 116 is TiW—Au or Ti—Au, and is Cu if the material of the seed film 116 is TiW—Cu or Ti—Cu). After depositing the plating film 120, the resist 118 is peeled away (FIG. 2I).

Figure 2J:
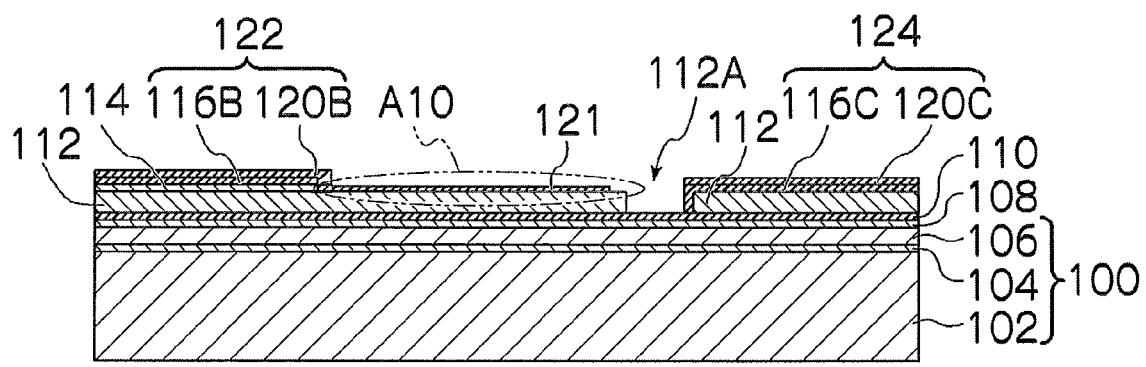

Next, the seed film 116 is patterned by etching (FIG. 2J). More specifically, the thickness of the seed film 116 is etched away by masking the active portion A10 by means of an organic film or metal film and then carrying out dry etching (RIE) using a fluoride or chloride gas or wet etching. Thereby, the seed film 116A on the active portion A10 is separated from the lower electrode film 110, and the upper electrode film (individual electrode) 121 is formed. Furthermore, the portion 116B of the seed film 116 on the insulating layer 114 and the plating film 120B on the portion 116B become the upper wire 122, and the portion 116C of the seed film 116, which is connected to the lower electrode film 110, and the plating film 120C on the portion 116C, become the lower wire 124, which is connected to the lower electrode film 110.

In the present embodiment, masking is only applied to the active portion A10 when etching the seed film 116; however, it is also possible to mask the whole surface (including the plating films 120B and 120C) apart from the connecting portion between the seed film 116A on the active portion A10 and the lower electrode film 110. Furthermore, instead of forming the seed film 116 on the piezoelectric film 112 and then etching, it is also possible to form the seed film 116 on the piezoelectric film 112 by means of a lift-off film deposition technique which uses a resist.

Figure 2K:
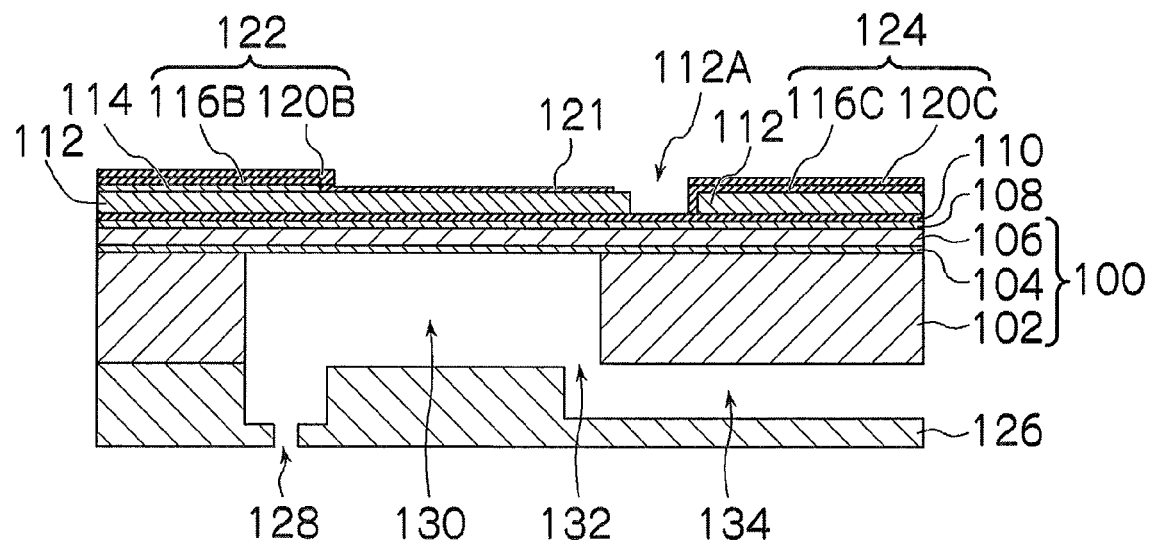

Thereupon, a pressure chamber 130 is formed on the supporting body (silicon substrate) 102 of the SOI substrate 100, on the lower surface in the drawing (FIG. 2K). The pressure chamber 130 is formed by etching, for example. Subsequently, a flow channel forming substrate 126 in which the nozzles 128 and the common flow channel 134 are formed is bonded to the lower surface side of the supporting body 102 (FIG. 2K).

The order of executing the step of annealing the piezoelectric film 112 and the step of forming the seed film 116 is not limited to the embodiment described above, and it is also possible to adopt a reverse order, in other words, to form the seed film 116 and then to carry out annealing of the piezoelectric film 112. However, since the piezoelectric characteristics of the piezoelectric film 112 can be improved by an annealing process, then it is desirable to anneal the piezoelectric film 112 and then to form the seed film 116, as in the present embodiment.

Moreover, it is also possible to pattern the seed film 116 (to form the upper electrode film 121) after the electroplating step.

Furthermore, in the present embodiment, the nozzle 128 and the pressure chamber 130 are formed after depositing the piezoelectric actuator 12; however, it is also possible to carry out the deposition step described above onto a substrate on which the nozzle 128 and the pressure chamber 130 have been formed previously.

According to the present embodiment, by simultaneously thickening the upper wire 122 connected to the upper electrode film 121 and the lower wire 124 connected to the lower electrode film 110, then it is possible to reduce the electrical resistances of the wires without thickening the upper electrode film 121 and the lower electrode film 110 which are positioned in the active portion A10. The present embodiment is suitable for a liquid ejection head having a multiple-element structure and a high nozzle density.

Second Embodiment

Next, a second embodiment of the present invention is described.

FIG. 3 is a diagram showing a plan view and a cross-sectional view of a liquid ejection head according to the second embodiment of the present invention.

As shown in FIG. 3, the piezoelectric actuator 12 according to the present embodiment has a structure in which the lower electrode film 110 is a common electrode and the upper electrode film 121 is an individual electrode (i.e., an upper address structure). The upper electrode film 121 is connected to an upper wire 144. The upper wire 144 is connected to an external wire (e.g., a flexible cable) (not shown). On the other hand, the lower electrode film 110 corresponding to the respective pressure chambers 130 is connected to lower wires 146, which are formed on a groove portion 112A of the piezoelectric film 112. The lower wires 146 are connected electrically to each other at a position that is not illustrated, and are earthed. The upper wire 144 and the lower wire 146 are deposited by electroplating to a greater thickness (e.g., 2 μm to 3 μm) than the upper electrode film 121 and the lower electrode film 110.

Next, the method of manufacturing the piezoelectric actuator according to the second embodiment is described. The steps until the deposition of the seed film 116 are the same as those in FIGS. 2A to 2F and description thereof is omitted here, and FIGS. 4A to 4E are cross-sectional diagrams showing the subsequent steps of the method of manufacturing the liquid ejection head (recording head) having the piezoelectric actuator according to the second embodiment of the present invention.

Figure 4A:
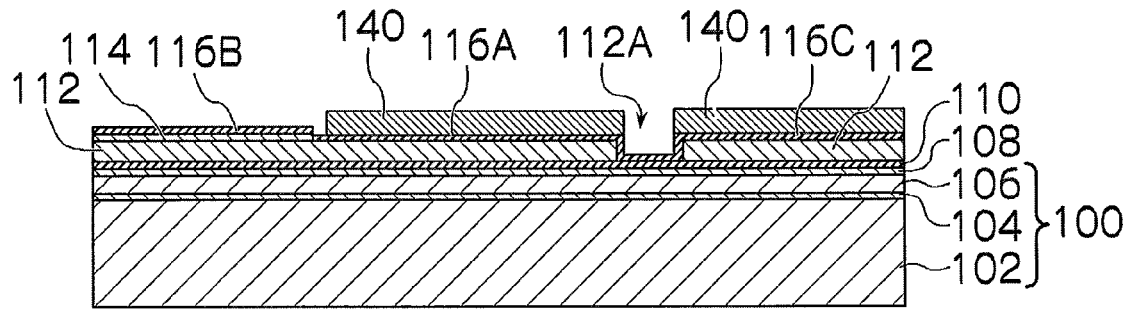
FIGS. 4A to 4E are cross-sectional diagrams showing the steps of a method of manufacturing a liquid ejection head having a piezoelectric actuator according to the second embodiment.

After depositing the seed film 116 on the piezoelectric film 112 (FIG. 2F), a resist 140 is applied on the seed film 116 (FIG. 4A). The resist 140 is a film made of an organic material, for example, and is applied in such a manner that only a portion 116B of the seed film 116 that is to form the upper wire 144, and the slit 112A, are exposed.

Figure 4B:
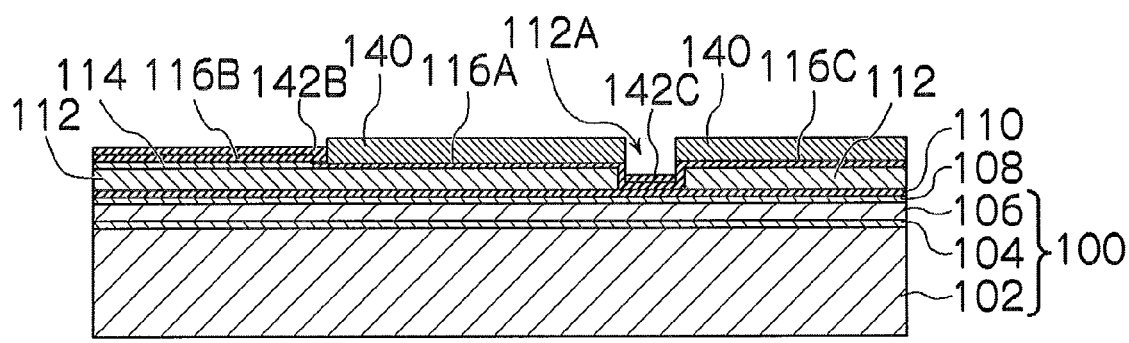
Figure 4C:
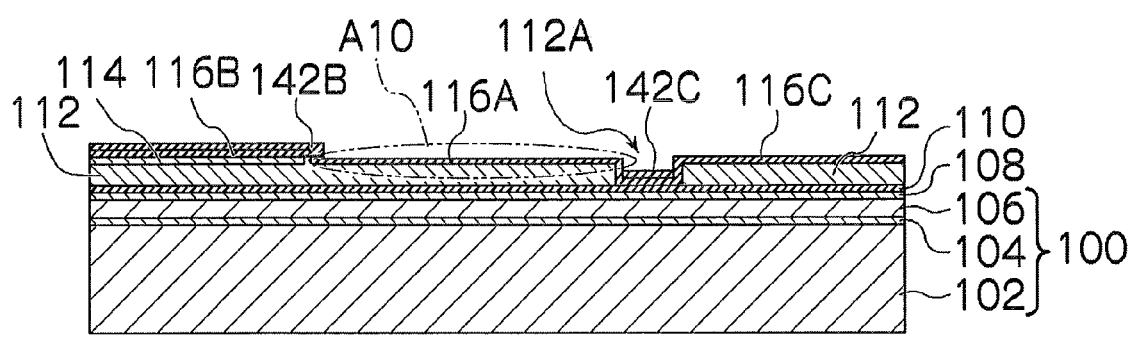

Next, a metal film (hereinafter referred to as a "plating film") 142 is deposited by electroplating on the seed film 116 (FIG. 4B). Here, the material of the plating film 142 is the similar material as that used in the exposed portion of the seed film 116 on the upper surface in the drawing (for example, the material of the plating film 142 is Au if the material of the seed film 116 is TiW—Au or Ti—Au, and is Cu if the material of the seed film 116 is TiW—Cu or Ti—Cu). The thickness of the plating film 142 is 2 μm to 3 μm, for example. After depositing the plating film 142, the resist 140 is peeled away (FIG. 4C).

Figure 4D:
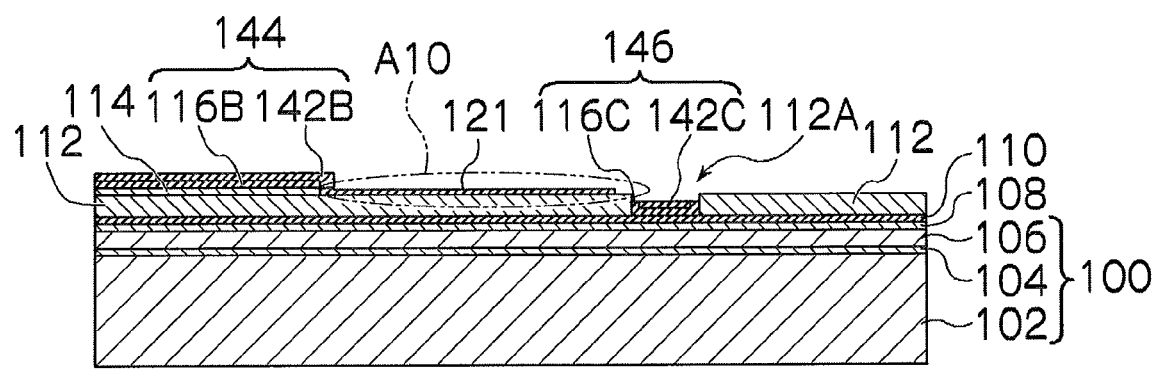

Next, the seed film 116 is patterned by etching and a seed film 116A on the active portion A10 is separated from the lower electrode film 110 (FIG. 4D). More specifically, the thickness of the seed film 116 is etched away by masking the active portion A10 by means of an organic film or metal film and then carrying out dry etching (RIE) using a fluoride or chloride gas or wet etching. Thereby, the seed film 116A on the active portion A10 is separated from the lower electrode film 110, and an upper electrode film (individual electrode) 121 is formed. Furthermore, the portion 116B of the seed film 116 on the insulating layer 114 and the plating film 142B on the portion 116B become the upper wire 144, and the portion 116C of the seed film 116 and the plating film 120C on the portion 116C become the lower wire 146, which is connected to the lower electrode film 110.

In the present embodiment, masking is only applied to the active portion A10 when etching the seed film 116; however, it is also possible to mask the whole surface (including the plating films 142B and 142C) apart from the connecting portion between the seed film 116A on the active portion A10 and the lower electrode film 110. Furthermore, instead of forming the seed film 116 on the piezoelectric film 112 and then etching, it is also possible to form the seed film 116 on the piezoelectric film 112 by means of a lift-off film deposition technique which uses a resist.

Figure 4E:
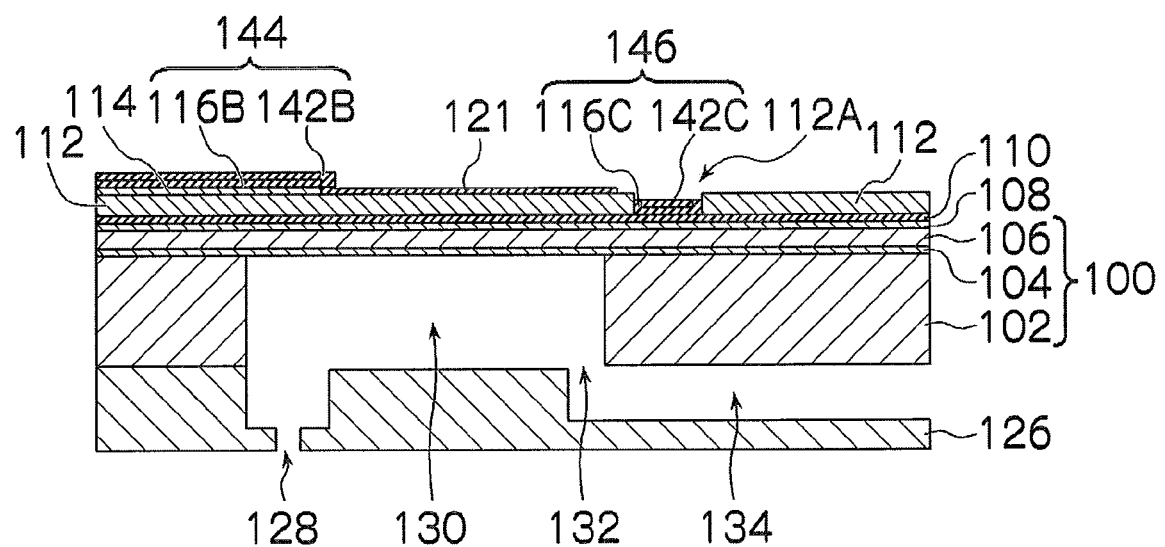

Thereupon, a pressure chamber 130 is formed on the supporting body (silicon substrate) 102 of the SOI substrate 100, on the lower surface in the drawing (FIG. 4E). The pressure chamber 130 is formed by etching, for example. Subsequently, a flow channel forming substrate 126 in which nozzles 128 and a common flow channel 134 are formed is bonded to the lower surface side of the supporting body 102 (FIG. 4E).

It is also possible to pattern the seed film 116 (form the upper electrode film 121) after the electroplating step.

Furthermore, in the present embodiment, the nozzle 128 and the pressure chamber 130 are formed after depositing the piezoelectric actuator 12; however, it is also possible to carry out the deposition step described above onto a substrate on which the nozzle 128 and the pressure chamber 130 have been formed previously.

According to the present embodiment, by simultaneously thickening the upper wire 144 connected to the upper electrode film 121 and the lower wire 146 connected to the lower electrode film 110, then it is possible to reduce the electrical resistances of the wires without thickening the upper electrode film 121 and the lower electrode film 110 which are positioned in the active portion A10.

In the present embodiment, it is possible to extend the lower wire 146 onto the piezoelectric film 112.

Figure 5:
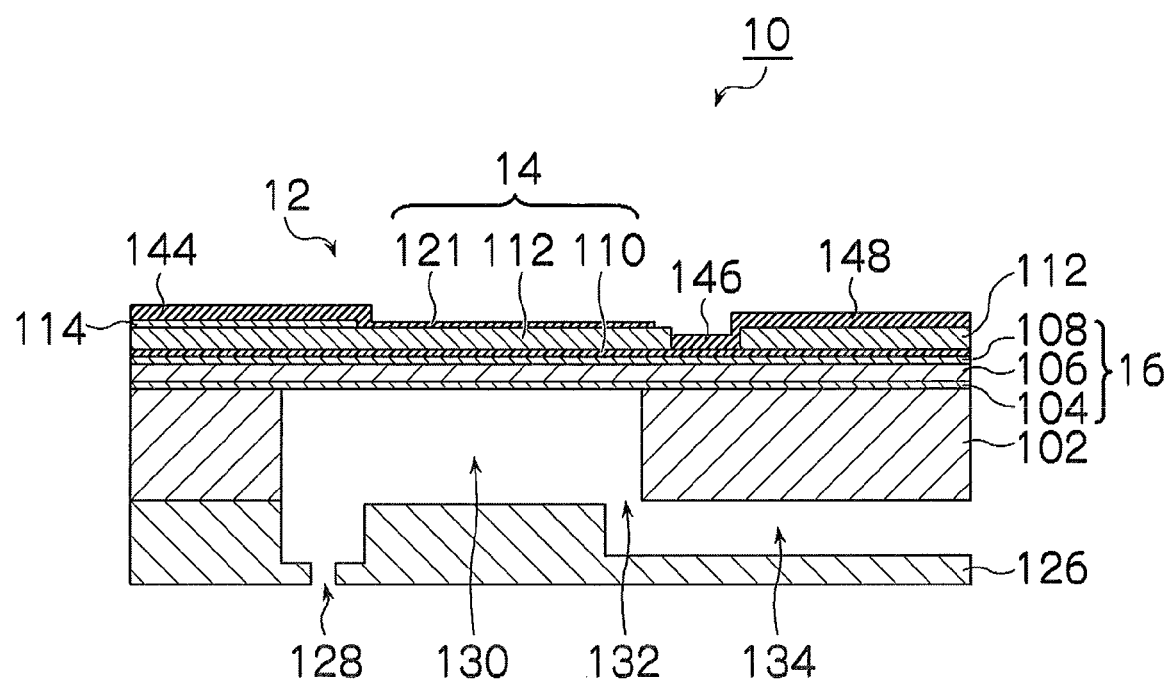
FIG. 5 is a cross-sectional diagram showing an embodiment where a lower wire is provided on the liquid ejection head (recording head) according to the second embodiment.

FIG. 5 is a cross-sectional diagram showing an embodiment where a lower wire is provided on the liquid ejection head (recording head) according to the second embodiment of the present invention.

In the embodiment shown in FIG. 5, the lower wire 146 extends onto the piezoelectric film 112 in the rightward direction in the drawing. The lower wires 146 are connected electrically to each other at a position that is not illustrated, and they are earthed. The portion 148 of the lower wire 146 on the piezoelectric film 112 can be formed simultaneously with the plating film 142, by electroplating. According to the embodiment shown in FIG. 6, it is possible further to increase the portion of the lower wire 146 that has a large film thickness and low electrical resistance, and it is possible further to reduce the electrical resistance of the lower wire 146.

Composition of Image Forming Apparatus

Next, an inkjet recording apparatus which is an embodiment of the image forming apparatus according to the present invention is described.

Figure 6:
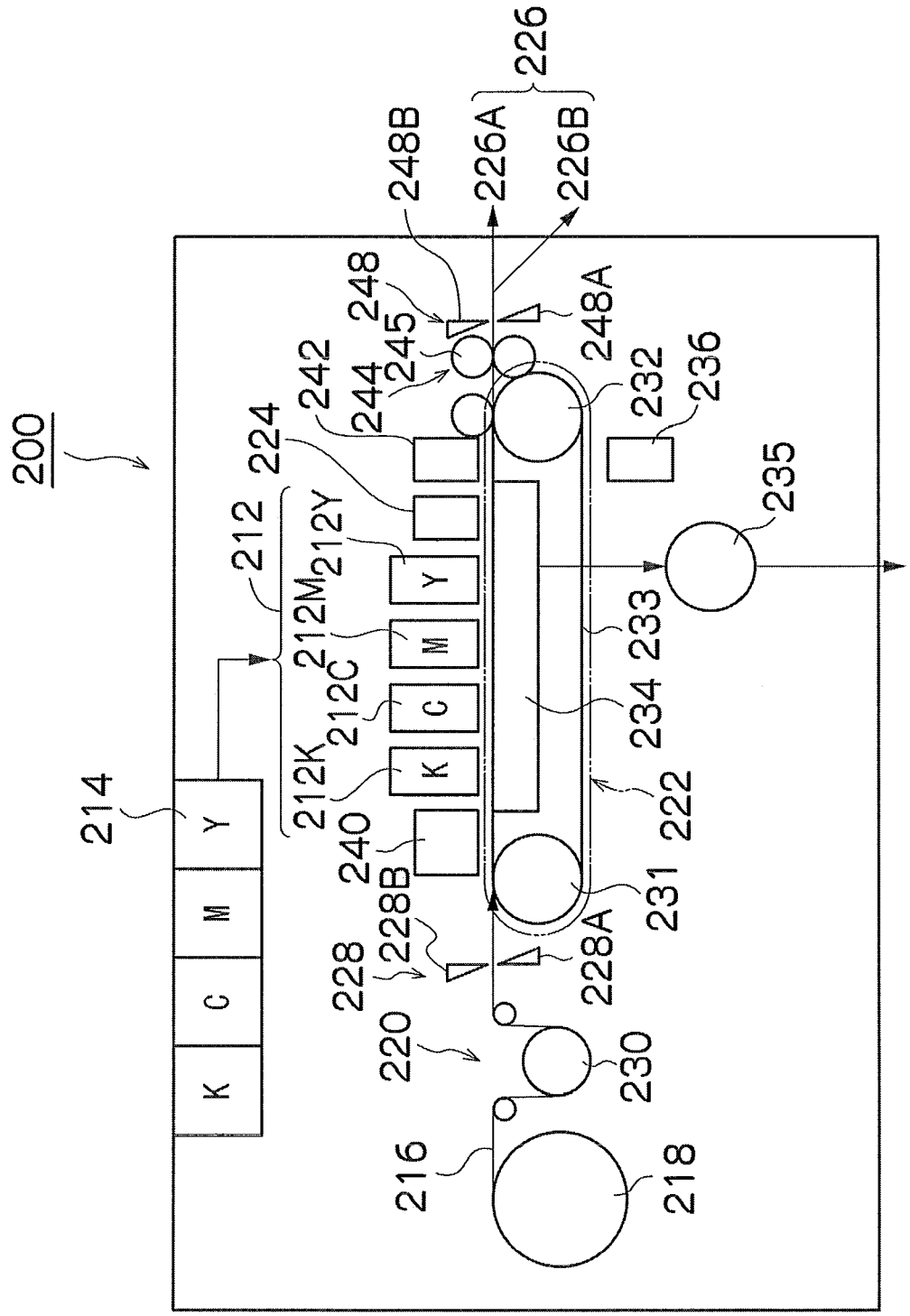
FIG. 6 is a general schematic drawing showing an inkjet recording apparatus according to an embodiment of the present invention.

FIG. 6 is a diagram of the general composition showing an outline of the inkjet recording apparatus 200. As shown in FIG. 6, the inkjet recording apparatus 200 includes: a printing unit 212 having a plurality of recording heads 212K, 212C, 212M, and 212Y for ink colors of black (K), cyan (C), magenta (M), and yellow (Y), respectively; an ink storing and loading unit 214 for storing inks of K, C, M and Y to be supplied to the recording heads 212K, 212C, 212M, and 212Y; a paper supply unit 218 for supplying recording paper 216; a decurling unit 220 for removing curl in the recording paper 216; a suction belt conveyance unit 222 disposed facing the nozzle face (ink-droplet ejection face) of the printing unit 212, for conveying the recording paper 216 while keeping the recording paper 216 flat; a print determination unit 224 for reading the printed result produced by the printing unit 212; and a paper output unit 226 for outputting image-printed recording paper (printed matter) to the exterior. Each of the recording heads 212K, 212C, 212M and 212Y corresponds to the recording head 10 shown in FIG. 1.

In FIG. 6, a magazine for rolled paper (continuous paper) is shown as an example of the paper supply unit 218; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 228 is arranged as shown in FIG. 6, and the roll paper is cut to a desired size by the cutter 228. The cutter 228 has a stationary blade 228A, whose length is not less than the width of the conveyor pathway of the recording paper 216, and a round blade 228B, which moves along the stationary blade 228A. The stationary blade 228A is disposed on the reverse side of the printed surface of the recording paper 216, and the round blade 228B is disposed on the printed surface side across the conveyance path. When cut paper is used, the cutter 228 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 216 delivered from the paper supply unit 218 retains curl due to having been loaded in the magazine. In order to remove the curl, heat is applied to the recording paper 216 in the decurling unit 220 by a heating drum 230 in the direction opposite from the curl direction in the magazine. The heating temperature at this time is preferably controlled so that the recording paper 216 has a curl in which the surface on which the print is to be made is slightly round outward.

The decurled and cut recording paper 216 is delivered to the suction belt conveyance unit 222. The suction belt conveyance unit 222 has a configuration in which an endless belt 233 is set around rollers 231 and 232 so that the portion of the endless belt 233 facing at least the nozzle face of the printing unit 212 and the sensor face of the print determination unit 224 forms a plane.

The belt 233 has a width that is greater than the width of the recording paper 216, and a plurality of suction apertures (not shown) are formed on the belt surface. A suction chamber 234 is disposed in a position facing the sensor surface of the print determination unit 224 and the nozzle surface of the printing unit 212 on the interior side of the belt 233, which is set around the rollers 231 and 232, as shown in FIG. 6. The suction chamber 234 provides suction with a fan 235 to generate a negative pressure, and the recording paper 216 is held on the belt 233 by suction.

The belt 233 is driven in the clockwise direction in FIG. 6 by the motive force of a motor (not shown) being transmitted to at least one of the rollers 231 and 232, which the belt 233 is set around, and the recording paper 216 held on the belt 233 is conveyed from left to right in FIG. 6.

Since ink adheres to the belt 233 when a marginless print job or the like is performed, a belt-cleaning unit 236 is disposed in a predetermined position (a suitable position outside the printing area) on the exterior side of the belt 233. Although the details of the configuration of the belt-cleaning unit 236 are not shown, examples thereof include a configuration in which the belt 233 is nipped with cleaning rollers such as a brush roller and a water absorbent roller, an air blow configuration in which clean air is blown onto the belt 233, or a combination of these. In the case of the configuration in which the belt 233 is nipped with the cleaning rollers, it is preferable to make the line velocity of the cleaning rollers different than that of the belt 233 to improve the cleaning effect.

The inkjet recording apparatus 200 may have a roller nip conveyance mechanism, in which the recording paper 216 is pinched and conveyed with nip rollers, instead of the suction belt conveyance unit 222. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 240 is disposed on the upstream side of the printing unit 212 in the conveyance pathway formed by the suction belt conveyance unit 222. The heating fan 240 blows heated air onto the recording paper 216 to heat the recording paper 216 immediately before printing so that the ink deposited on the recording paper 216 dries more easily.

The printing unit 212 is a so-called "full line head" in which a line head having a length corresponding to the maximum paper width is arranged in a direction (main scanning direction) that is perpendicular to the paper conveyance direction (sub-scanning direction). The recording heads 212K, 212C, 212M and 212Y forming the printing unit 212 are constituted by line heads in which a plurality of ink ejection ports (nozzles) are arranged through a length exceeding at least one edge of the maximum size recording paper 216 intended for use with the inkjet recording apparatus 200 (see FIG. 7).

The recording heads 212K, 212C, 212M, and 212Y are arranged in the order of black (K), cyan (C), magenta (M), and yellow (Y) from the upstream side (from left in FIG. 6), along the conveyance direction of the recording paper 216 (paper conveyance direction). A color image can be formed on the recording paper 216 by ejecting the inks from the recording heads 212K, 212C, 212M, and 212Y, respectively, onto the recording paper 216 while conveying the recording paper 216.

The printing unit 212, in which the full-line heads covering the entire width of the paper are thus provided for the respective ink colors, can record an image over the entire surface of the recording paper 216 by performing the action of moving the recording paper 216 and the printing unit 212 relative to each other in the paper conveyance direction (sub-scanning direction) just once (in other words, by means of a single sub-scan). Higher-speed printing is thereby made possible and productivity can be improved in comparison with a shuttle type head configuration in which a recording head moves reciprocally in the direction (main scanning direction) that is perpendicular to the paper conveyance.

Although a configuration with four standard colors, K M C and Y, is described in the present embodiment, the combinations of the ink colors and the number of colors are not limited to these, and light and/or dark inks can be added as required. For example, a configuration is possible in which recording heads for ejecting light-colored inks such as light cyan and light magenta are added.

As shown in FIG. 6, the ink storing and loading unit 214 has ink tanks for storing the inks of the colors corresponding to the respective recording heads 212K, 212C, 212M, and 212Y, and the respective tanks are connected to the recording heads 212K, 212C, 212M, and 212Y by means of channels (not shown). The ink storing and loading unit 214 has a warning device (for example, a display device or an alarm sound generator and the like) for warning when the remaining amount of any ink is low, and has a mechanism for preventing loading errors among the colors.

The print determination unit 224 has an image sensor (line sensor and the like) for capturing an image of the ink-droplet deposition result of the printing unit 212, and functions as a device to check for ejection defects such as clogs of the nozzles in the printing unit 212 from the ink-droplet deposition results evaluated by the image sensor.

The print determination unit 224 of the present embodiment is configured with at least a line sensor having rows of photoelectric transducing elements with a width that is greater than the ink-droplet ejection width (image recording width) of the recording heads 212K, 212C, 212M, and 212Y This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 224 reads a test pattern image printed by the recording heads 212K, 212C, 212M, and 212Y for the respective colors, and the ejection of each head is determined. The ejection determination includes the presence of the ejection, measurement of the dot size, and measurement of the dot deposition position.

A post-drying unit 242 is disposed following the print determination unit 224. The post-drying unit 242 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressurizing unit 244 is disposed following the post-drying unit 242. The heating/pressurizing unit 244 is a device to control the glossiness of the image surface, and the image surface is pressed with a pressure roller 245 having a predetermined uneven surface shape while the image surface is heated, and the uneven shape is transferred to the image surface.

The printed matter generated in this manner is outputted from the paper output unit 226. The target print (i.e., the result of printing the target image) and the test print are preferably outputted separately. In the inkjet recording apparatus 200, a sorting device (not shown) is provided for switching the outputting pathways in order to sort the printed matter with the target print and the printed matter with the test print, and to send them to paper output units 226A and 226B, respectively. When the target print and the test print are simultaneously formed in parallel on the same large sheet of paper, the test print portion is cut and separated by a cutter (second cutter) 248. The cutter 248 is disposed directly in front of the paper output unit 226, and is used for cutting the test print portion from the target print portion when a test print has been performed in the blank portion of the target print. The structure of the cutter 248 is the same as the first cutter 228 described above, and has a stationary blade 248A and a round blade 248B. Although not shown in FIG. 6, the paper output unit 226A for the target prints is provided with a sorter for collecting prints according to print orders.

Figure 8:
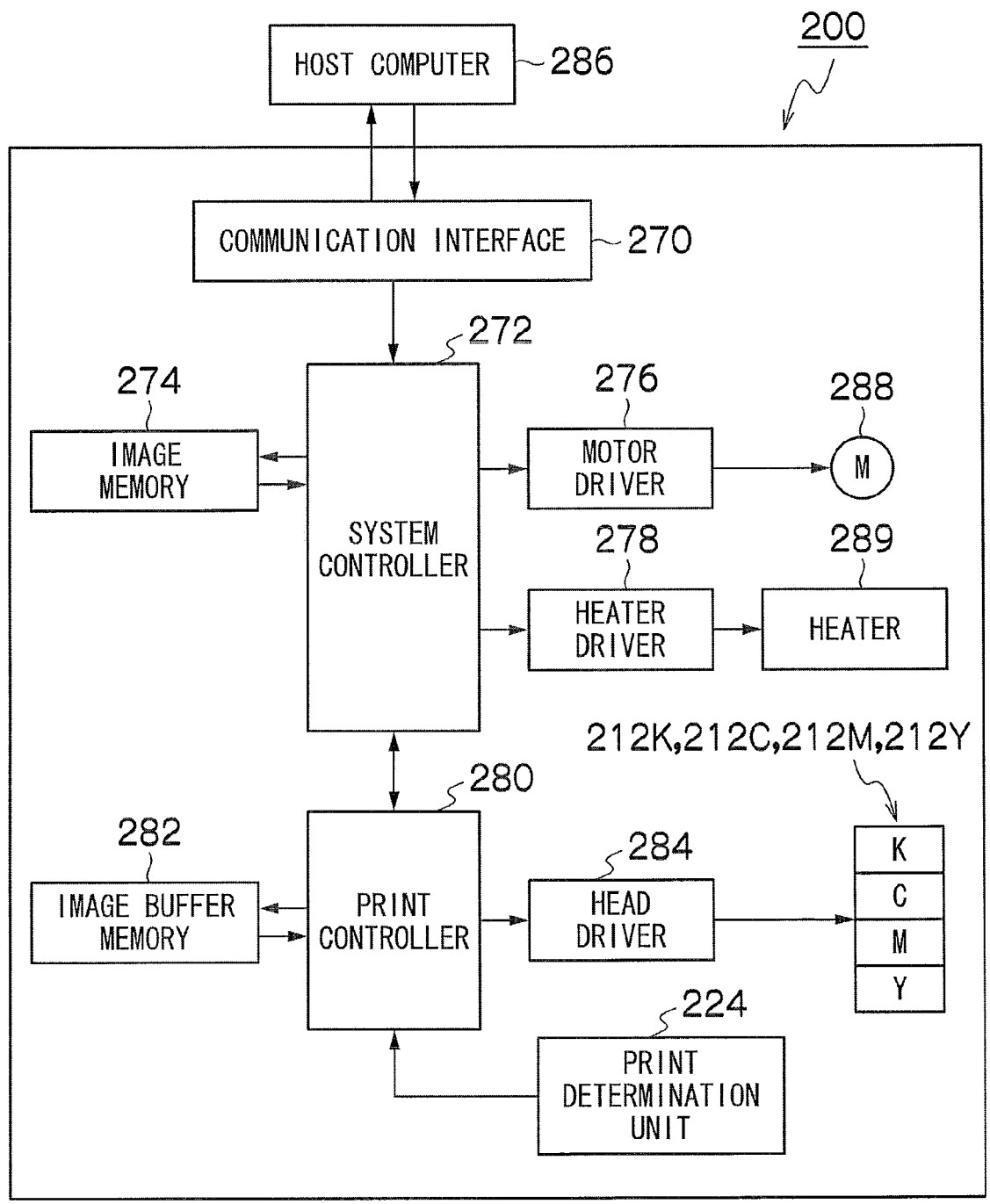
FIG. 8 is a principal block diagram showing the control system of the inkjet recording apparatus.

FIG. 8 is a principal block diagram showing the control system of the inkjet recording apparatus 200. The inkjet recording apparatus 200 has a communication interface 270, a system controller 272, an image memory 274, a motor driver 276, a heater driver 278, a print controller 280, an image buffer memory 282, a head driver 284, and the like.

The communication interface 270 is an interface unit for receiving image data sent from a host computer 286. A serial interface such as USB (Universal Serial Bus), IEEE1394, Ethernet (trademark), wireless network, or a parallel interface such as a Centronics interface may be used as the communication interface 270. A buffer memory (not shown) may be mounted in this portion in order to increase the communication speed. The image data sent from the host computer 286 is received by the inkjet recording apparatus 200 through the communication interface 270, and is temporarily stored in the image memory 274.

The image memory 274 is a storage device for temporarily storing images inputted through the communication interface 270, and data is written and read to and from the image memory 274 through the system controller 272. The image memory 274 is not limited to a memory composed of semiconductor elements, and a hard disk drive or another magnetic medium may be used.

The system controller 272 is a control unit for controlling the various sections, such as the communications interface 270, the image memory 274, the motor driver 276, the heater driver 278, and the like. The system controller 272 is constituted by a central processing unit (CPU) and peripheral circuits thereof, and the like, and in addition to controlling communications with the host computer 286 and controlling reading and writing from and to the image memory 274, or the like, it also generates a control signal for controlling the motor 288 of the conveyance system and the heater 289.

The motor driver (drive circuit) 276 drives the motor 288 in accordance with commands from the system controller 272. The heater driver (drive circuit) 278 drives the heater 289 of the post-drying unit 242 or the like in accordance with commands from the system controller 272.

The print controller 280 has a signal processing function for performing various tasks, compensations, and other types of processing for generating print control signals from the image data stored in the image memory 274 in accordance with commands from the system controller 272 so as to supply the generated print control signal (dot data) to the head driver 284. Prescribed signal processing is carried out in the print controller 280, and the ejection amount and the ejection timing of the ink from the respective recording heads 212K, 212C, 212M, and 212Y are controlled via the head driver 284, on the basis of the print data. By this means, prescribed dot size and dot positions can be achieved.

The print controller 280 is provided with the image buffer memory 282; and image data, parameters, and other data are temporarily stored in the image buffer memory 282 when image data is processed in the print controller 280. The aspect shown in FIG. 8 is one in which the image buffer memory 282 accompanies the print controller 280; however, the image memory 274 may also serve as the image buffer memory 282. Also possible is an aspect in which the print controller 280 and the system controller 272 are integrated to form a single processor.

The head driver 284 generates drive signals for driving the piezoelectric elements 36 (see FIG. 1) of the recording heads 212K, 212C, 212M, 212Y of the respective colors, on the basis of the dot data supplied from the print controller 280, and supplies the generated drive signals to the piezoelectric elements 36. It is also possible to include a feedback control system in the head driver 284 in order to maintain uniform drive conditions of the recording heads 212K, 212C, 212M and 212Y.

The print determination unit 224 is a block that includes the line sensor as described above with reference to FIG. 6, reads the image printed on the recording paper 216, determines the print conditions (presence of the ejection, variation in the dot formation, and the like) by performing desired signal processing, or the like, and provides the determination results of the print conditions to the print controller 280.

According to requirements, the print controller 280 makes various corrections with respect to the recording head 212K, 212C, 212M and 212Y on the basis of information obtained from the print determination unit 224.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a piezoelectric actuator, comprising the steps of:
    forming a lower electrode film on an insulating substrate;
    forming a piezoelectric film on the lower electrode film;
    forming a slit on the piezoelectric film to expose a portion of the lower electrode film through an upper surface side of the piezoelectric film;
    forming an insulating layer which covers a portion of the piezoelectric film;
    forming an upper electrode film so as to span the insulating layer and the piezoelectric film;
    forming, on the piezoelectric film, a lower wire in connection with the portion of the lower electrode film exposed through the slit;
    depositing a first metal film on the lower wire and thereby making a film thickness of the lower wire greater than a film thickness of the lower electrode film; and
    depositing a second metal film on a portion of the upper electrode film on the insulating layer and thereby making a film thickness of the portion of the upper electrode film on the insulating layer greater than a film thickness of a portion of the upper electrode film that has been deposited directly on the piezoelectric film.

2. The method as defined in claim 1, wherein the first and second metal films are simultaneously deposited by carrying out electrolytic plating on the lower wire and the portion of the upper electrode film on the insulating layer.

3. The method as defined in claim 1, further comprising the step of forming a third metal film which covers the piezoelectric film in which the slit has been formed, and is in connection with the portion of the lower electrode film exposed through the slit, wherein:
    in the upper electrode film forming step, the upper electrode film is formed by patterning the third metal film to separate a portion of the third metal film from the portion of the lower electrode film exposed through the slit; and
    in the lower wire forming step, the lower wire is formed by patterning the third metal film.

* * * * *